(12) United States Patent
Kuwahara

(10) Patent No.: US 11,309,868 B2
(45) Date of Patent: Apr. 19, 2022

(54) MULTIPLEXER

(71) Applicant: TAIYO YUDEN CO., LTD., Tokyo (JP)

(72) Inventor: Eiji Kuwahara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/417,286

(22) Filed: May 20, 2019

(65) Prior Publication Data

US 2020/0067490 A1 Feb. 27, 2020

(30) Foreign Application Priority Data

Aug. 24, 2018 (JP) .............................. JP2018-156913

(51) Int. Cl.
| | |
|---|---|
| *H03H 9/72* | (2006.01) |
| *H03H 7/01* | (2006.01) |
| *H03H 9/54* | (2006.01) |
| *H03H 9/205* | (2006.01) |
| *H03H 9/64* | (2006.01) |

(52) U.S. Cl.
CPC ............ *H03H 9/72* (2013.01); *H03H 7/0161* (2013.01); *H03H 9/205* (2013.01); *H03H 9/54* (2013.01); *H03H 9/64* (2013.01)

(58) Field of Classification Search
CPC ............ H03H 9/72; H03H 9/205; H03H 9/54; H03H 9/64; H03H 7/0161
See application file for complete search history.

(56) References Cited

U.S. PATENT DOCUMENTS

| | | | |
|---|---|---|---|
| 5,710,529 A | 1/1998 | Sugiyama et al. | ............ 333/193 |
| 2005/0110599 A1 | 5/2005 | Kanasaki et al. | ............ 333/193 |

(Continued)

FOREIGN PATENT DOCUMENTS

| | | |
|---|---|---|
| JP | 7-231240 A | 8/1995 |
| JP | 2005-159563 A | 6/2005 |

(Continued)

OTHER PUBLICATIONS

Notice of Reasons for Refusal dated Nov. 30, 2021, issued to corresponding Japanese Application No. 2018-156913.

(Continued)

*Primary Examiner* — Samuel S Outten
(74) *Attorney, Agent, or Firm* — Stein IP, LLC

(57) ABSTRACT

A multiplexer includes: a first terminal; a second terminal; a third terminal; a first filter connected between the first and second terminals, including a first capacitor, a first inductor, and one or more first acoustic wave resonators, and having a first passband; a second filter connected between the first and third terminals, including a second capacitor, a second inductor, and one or more second acoustic wave resonators, and having a second passband higher than the first passband; a substrate having a surface on which at least one first acoustic wave resonator of the one or more first acoustic wave resonators and at least one second acoustic wave resonator of the one or more second acoustic wave resonators are located; and a metal structure located on the surface and located between the at least one first acoustic wave resonator and the at least one second acoustic wave resonator.

18 Claims, 13 Drawing Sheets

(56) References Cited

U.S. PATENT DOCUMENTS

| | | | |
|---|---|---|---|
| 2006/0197630 A1* | 9/2006 | Fuse | H03H 9/0576 333/133 |
| 2010/0052838 A1* | 3/2010 | Matsuta | H01F 17/0013 336/200 |
| 2012/0241211 A1* | 9/2012 | Inoue | H03H 9/1064 174/564 |
| 2013/0314173 A1* | 11/2013 | Inoue | H03H 9/70 333/133 |
| 2015/0194948 A1* | 7/2015 | Inate | H03H 3/08 333/133 |
| 2016/0142041 A1* | 5/2016 | Kuwahara | H03H 9/706 333/195 |
| 2017/0179930 A1* | 6/2017 | Tsukamoto | H03H 9/542 |
| 2017/0214390 A1 | 7/2017 | Tsukamoto | 9/542 |
| 2017/0257078 A1* | 9/2017 | Leipold | H03H 9/605 |
| 2018/0042107 A1* | 2/2018 | Yosui | H05K 1/183 |
| 2018/0226952 A1 | 8/2018 | Tanaka et al. | |

FOREIGN PATENT DOCUMENTS

| | | |
|---|---|---|
| JP | 2006-60747 A | 3/2006 |
| JP | 2015-070489 A | 4/2015 |
| JP | 2016-046630 A | 4/2016 |
| JP | 2017-135445 A | 8/2017 |
| JP | 2018-129680 A | 8/2018 |
| JP | 2018-129683 A | 8/2018 |
| WO | WO 2005/011114 A1 | 2/2005 |
| WO | WO 2008/038498 A1 | 4/2008 |
| WO | WO 2014/050307 A1 | 4/2014 |

OTHER PUBLICATIONS

Japanese Decision of Refusal dated 2018-156913 issued by the Japanese Patent Office in corresponding application JP 2018-156913.

* cited by examiner

FIG. 6A SAMPLE A

FIG. 6B SAMPLE B

MULTIPLEXER

CROSS-REFERENCE TO RELATED APPLICATION

This application is based upon and claims the benefit of priority of the prior Japanese Patent Application No. 2018-156913, filed on Aug. 24, 2018, the entire contents of which are incorporated herein by reference.

FIELD

A certain aspect of the present invention relates to a multiplexer.

BACKGROUND

There has been known a filter in which an acoustic wave resonator is provided to an LC circuit formed of a capacitor and an inductor as disclosed in, for example, Japanese Patent Application Publication Nos. 2018-129680 and 2018-129683 (hereinafter, referred to as Patent Documents 1 and 2, respectively).

SUMMARY OF THE INVENTION

According to an aspect of the present invention, there is provided a multiplexer including: a first terminal; a second terminal; a third terminal; a first filter that is connected between the first terminal and the second terminal, includes a first capacitor, a first inductor, and one or more first acoustic wave resonators, and has a first passband; a second filter that is connected between the first terminal and the third terminal, includes a second capacitor, a second inductor, and one or more second acoustic wave resonators, and has a second passband higher than the first passband; a substrate that has a surface on which at least one first acoustic wave resonator of the one or more first acoustic wave resonators and at least one second acoustic wave resonator of the one or more second acoustic wave resonators are located; and a metal structure that is located on the surface, and is located between the at least one first acoustic wave resonator and the at least one second acoustic wave resonator.

DETAILED DESCRIPTION

When an acoustic wave resonator is provided to an LC circuit, steepness of the attenuation between a passband and a guard band is improved. However, when a filter having an acoustic wave resonator is used in a multiplexer, the isolation characteristic may deteriorate.

Hereinafter, a description will be given of embodiments of the present invention with reference to the accompanying drawings.

First Embodiment

Figure 1A:
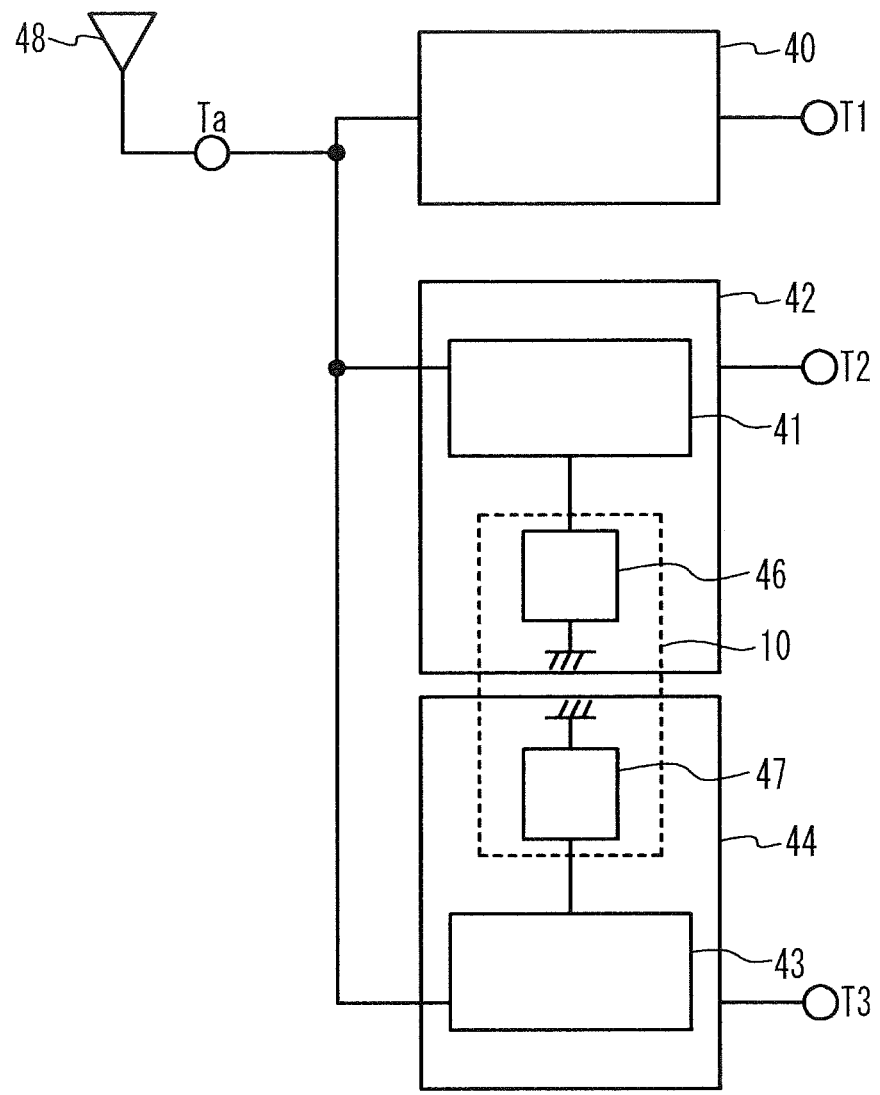
FIG. 1A is a block diagram of a multiplexer in accordance with a first embodiment.

FIG. 1A is a block diagram of a multiplexer in accordance with a first embodiment; As illustrated in FIG. 1A, a terminal Ta is coupled to an antenna 48. A filter 40 is connected between the terminal Ta and a terminal T1. A filter 42 is connected between the terminal Ta and a terminal T2. A filter 44 is connected between the terminal Ta and a terminal T3. The filter 42 includes an LC circuit 41 and an acoustic wave resonator 46. The filter 44 includes an LC circuit 43 and an acoustic wave resonator 47. Each of the LC circuits 41 and 43 is a circuit formed of a capacitor and an inductor, and includes no acoustic wave resonator. The LC circuit 41 is electrically connected to the acoustic wave resonator 46, and the LC circuit 43 is electrically connected to the acoustic wave resonator 47. The acoustic wave resonators 46 and 47 are located on a single substrate 10.

The filter 40 is a filter that allows signals in a low band to pass therethrough, the filter 42 is a filter that allows signals in a middle band to pass therethrough, and the filter 44 is a filter that allows signals in a high band to pass therethrough. The filters 40, 42, and 44 are bandpass filters. The filter 40 may be a low-pass filter. The filter 44 may be a high-pass filter. The filter 40 allows signals in the low band to pass therethrough, and suppresses signals in the middle band and the high band. The filter 42 allows signals in the middle band to pass therethrough, and suppresses signals in the low band and the high band. The filter 44 allows signals in the high band to pass therethrough, and suppresses signals in the low band and the middle band.

The low band is a band from 700 MHz to 960 MHz, the middle band is a band from 1710 MHz to 2200 MHz, and the high band is a band from 2300 MHz to 2690 MHz. Each of the low band, the middle band, and the high band includes a plurality of bands supporting a frequency band standard (E-UTRA operating band) corresponding to the long term evolution (LTE).

The passband of the filter 42 is wider than the middle band, and the passband of the filter 44 is wider than the high band. The middle band and the high band have a passband width of 300 MHz or greater. The filters 42 and 44 having such a wide band are formed of an LC circuit. However, the gap between the passbands of the middle band and the high band is 100 MHz. Thus, the filters 42 and 44 are required to achieve steepness of the attenuation between the passband and the guard band. However, when the filter is formed of an LC circuit, the steepness is insufficient. Thus, the acoustic wave resonators 46 and 47 are coupled to the LC circuits 41 and 43, respectively. This structure improves the steepness in the filters 42 and 44.

Figure 1B:
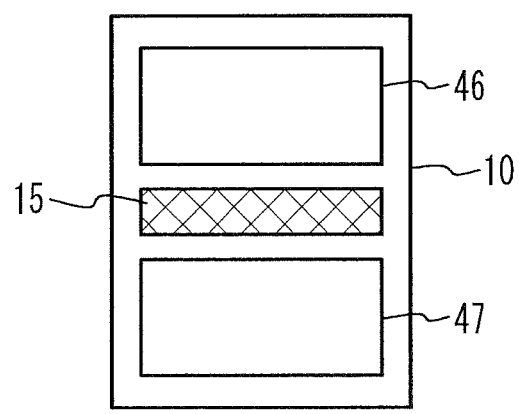
FIG. 1B is a plan view of a substrate in the first embodiment.

FIG. 1B is a plan view of a substrate in the first embodiment. As illustrated in FIG. 1B, the acoustic wave resonators 46 and 47 are located on the upper surface of the substrate 10. A metal pattern 15 is directly located on the upper surface of the substrate 10 between the acoustic wave resonators 46 and 47, or is located on the upper surface of the substrate 10 between the acoustic wave resonators 46 and 47 through an insulating film. The metal pattern 15 is a metal film such as, but not limited to, a copper film, a gold film, an aluminum film, or a nickel film. When the acoustic wave resonators 46 and 47 are located on the single substrate 10, the size of the multiplexer is reduced. However, the acoustic wave resonators 46 and 47 interfere with each other through the substrate 10, and thereby, the isolation characteristic between the filters 42 and 44 deteriorates. In the first embodiment, the provision of the metal pattern 15 improves the isolation characteristic between the filters 42 and 44.

Figure 2A:
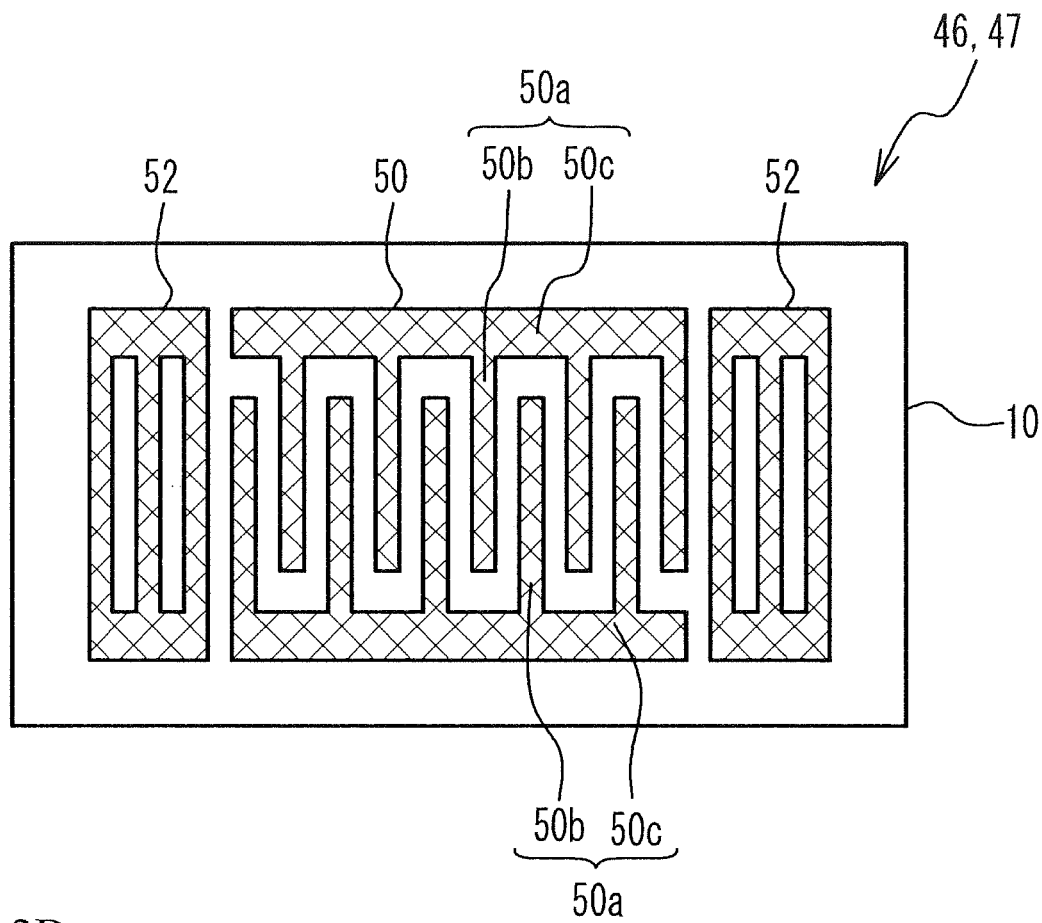
FIG. 2A is a plan view of an acoustic wave resonator in the first embodiment.
Figure 2B:
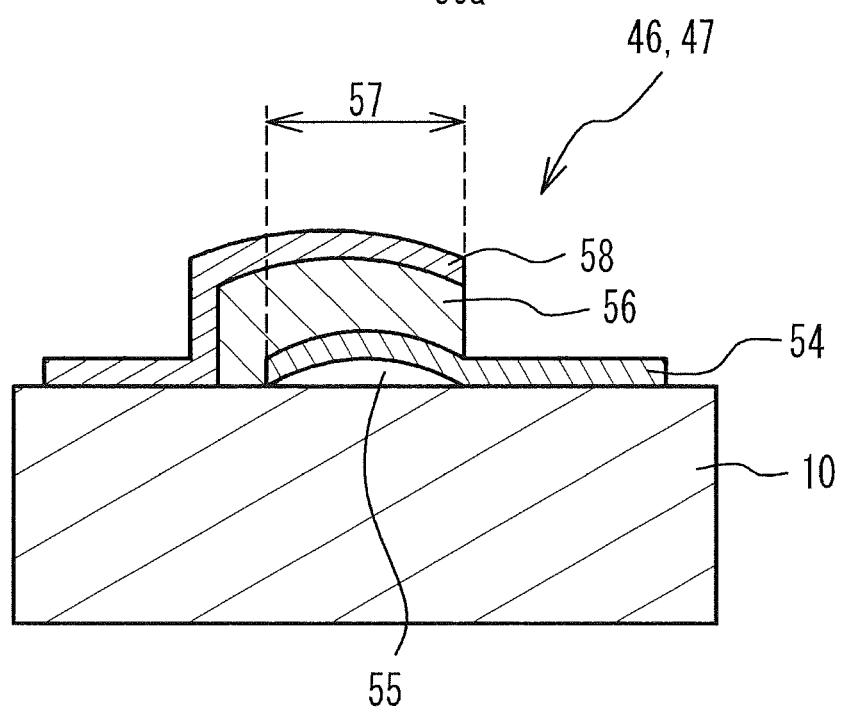
FIG. 2B is a cross-sectional view of another acoustic wave resonator in the first embodiment.

FIG. 2A is a plan view of an exemplary acoustic wave resonator in the first embodiment, and FIG. 2B is a cross-sectional view of another exemplary acoustic wave resonator in the first embodiment. FIG. 2A illustrates a case where the acoustic wave resonators 46 and 47 are surface acoustic wave resonators. An interdigital transducer (IDT) 50 and reflectors 52 are located on the upper surface of the substrate 10. The IDT 50 includes a pair of comb-shaped electrodes 50a facing each other. The comb-shaped electrode 50a includes a plurality of electrode fingers 50b and a bus bar 50c connecting the electrode fingers 50b. The reflectors 52 are located at both sides of the IDT 50. The IDT 50 excites a surface acoustic wave on the substrate 10. The substrate 10 is a piezoelectric substrate such as, but not limited to, a lithium tantalate substrate, a lithium niobate substrate, or a crystal substrate. The substrate 10 may be a composite substrate having a structure in which a piezoelectric substrate is bonded on a support substrate such as, but not limited to, a sapphire substrate, a spinel substrate, an alumina substrate, a crystal substrate, or a silicon substrate. The IDT 50 and the reflectors 52 are formed of, for example, an aluminum film or a copper film. A protective film or a temperature compensation film may be located on the substrate 10 so as to cover the IDT 50 and the reflectors 52.

FIG. 2B illustrates a case where the acoustic wave resonators 46 and 47 are piezoelectric thin film resonators. A piezoelectric film 56 is located on the substrate 10. A lower electrode 54 and an upper electrode 58 are located so as to sandwich the piezoelectric film 56. An air gap 55 is formed between the lower electrode 54 and the substrate 10. The region in which the lower electrode 54 and the upper electrode 58 face each other across at least a part of the piezoelectric film 56 is a resonance region 57. The lower electrode 54 and the upper electrode 58 in the resonance region 57 excites an acoustic wave in the thickness extension mode in the piezoelectric film 56. The substrate 10 is, for example, a sapphire substrate, a spinel substrate, an alumina substrate, a glass substrate, a crystal substrate, or a silicon substrate. The lower electrode 54 and the upper electrode 58 are formed of a metal film such as, but not limited to, a ruthenium film. The piezoelectric film 56 is, for example, an aluminum nitride film.

Figure 3A:
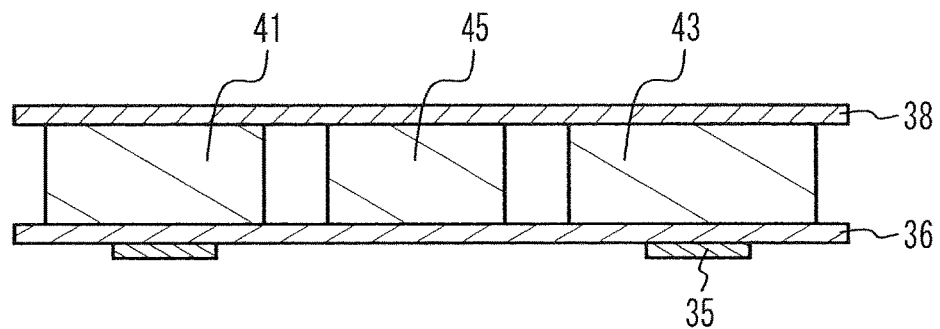
FIG. 3A is a cross-sectional view of the multiplexer in accordance with the first embodiment.

FIG. 3A is a cross-sectional view of the multiplexer in accordance with the first embodiment. As illustrated in FIG. 3A, the LC circuits 41 and 43 and a package 45 are mounted between a substrate 36 and a lid 38. Terminals 35 are located on the lower surface of the substrate 36. The LC circuits 41 and 43 are dielectric filters in which a capacitor and an inductor are formed of a multilayered body in which dielectric layers are stacked. The dielectric layer is, for example, a ceramic layer. The LC circuits 41 and 43 may be formed of a chip capacitor and a chip inductor. The package 45 is a package in which the substrate 10 is mounted. The substrate 36 is, for example, a printed board, and the lid 38 is, for example, an insulating plate such as, but not limited to a resin plate. The terminals 35 are the terminals Ta and T1 through T3, and are electrically connected to the LC circuits 41 and 43 and the package 45.

Figure 3B:
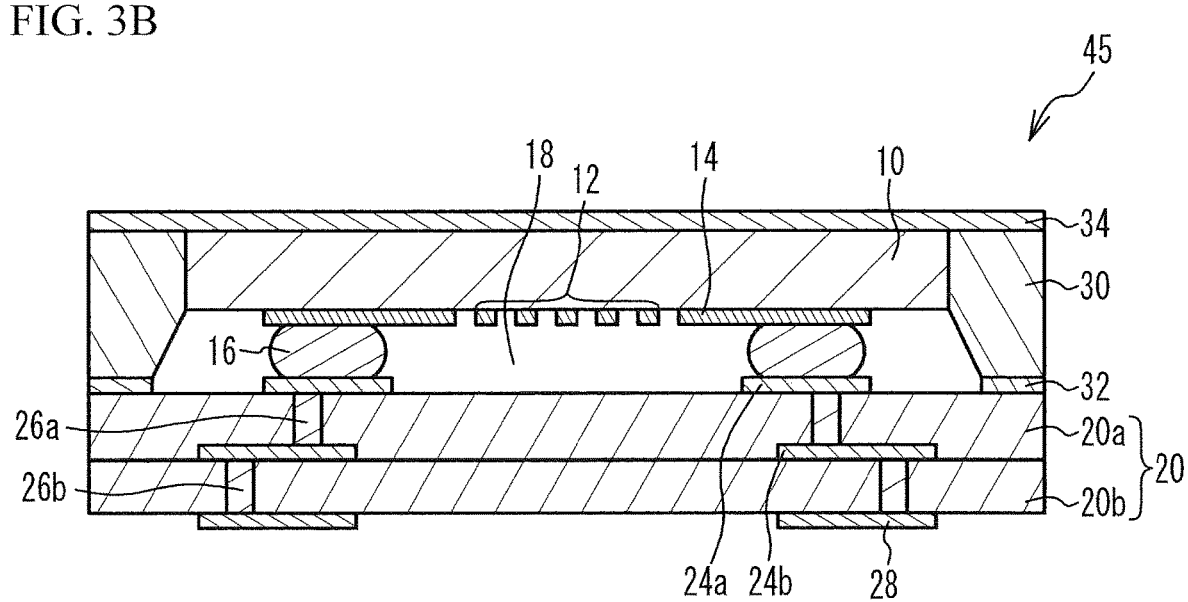
FIG. 3B is a cross-sectional view of a package in the first embodiment.

FIG. 3B is a cross-sectional view of the package in the first embodiment. As illustrated in FIG. 3B, the substrate 10 is mounted on a circuit board 20. The circuit board 20 includes a plurality of insulating layers 20a and 20b that are stacked. The insulating layers 20a and 20b are, for example, resin layers or ceramic layers. A wiring layer 24a and a ring-shaped metal layer 32 are located on the upper surface of the circuit board 20. A wiring layer 24b is located on the insulating layer 20b. Penetrating electrodes 26a penetrating through the insulating layer 20a and penetrating electrodes 26b penetrating through the insulating layer 20b are provided. Terminals 28 are located on the lower surface of the circuit board 20. The wiring layers 24a and 24b, the penetrating electrodes 26a and 26b, and the terminals 28 are formed of a metal layer such as, but not limited to, a copper layer, a gold layer, an aluminum layer, or a nickel layer.

Acoustic wave resonators 12 and wiring lines 14 are located on the lower surface of the substrate 10. The acoustic wave resonators 12 are the acoustic wave resonators 46 and 47 illustrated in FIG. 2A and FIG. 2B. The wiring lines 14 are formed of a metal layer such as, but not limited to, a copper layer, a gold layer, and an aluminum layer. The wiring line 14 and the wiring layer 24a are bonded by a bump 16. The bump 16 is a metal bump such as, but not limited to, a gold bump, a copper bump, or a solder bump. The substrate 10 is flip-chip mounted on the circuit board 20 with use of the bump 16 so that the acoustic wave resonator 12 faces the circuit board 20 across an air gap 18. The terminal 28 is electrically connected to the acoustic wave resonator 12 through the penetrating electrode 26a, the wiring layer 24b, the penetrating electrode 26b, the wiring layer 24a, the bump 16, and the wiring line 14.

A sealing portion 30 is located so as to surround the substrate 10. The lower surface of the sealing portion 30 is bonded to the ring-shaped metal layer 32. The sealing portion 30 is made of metal such as solder or an insulating material such as resin. A lid 34 is located on the upper surfaces of the substrate 10 and the sealing portion 30. The lid 34 is a metal plate or an insulating plate.

Figure 4:
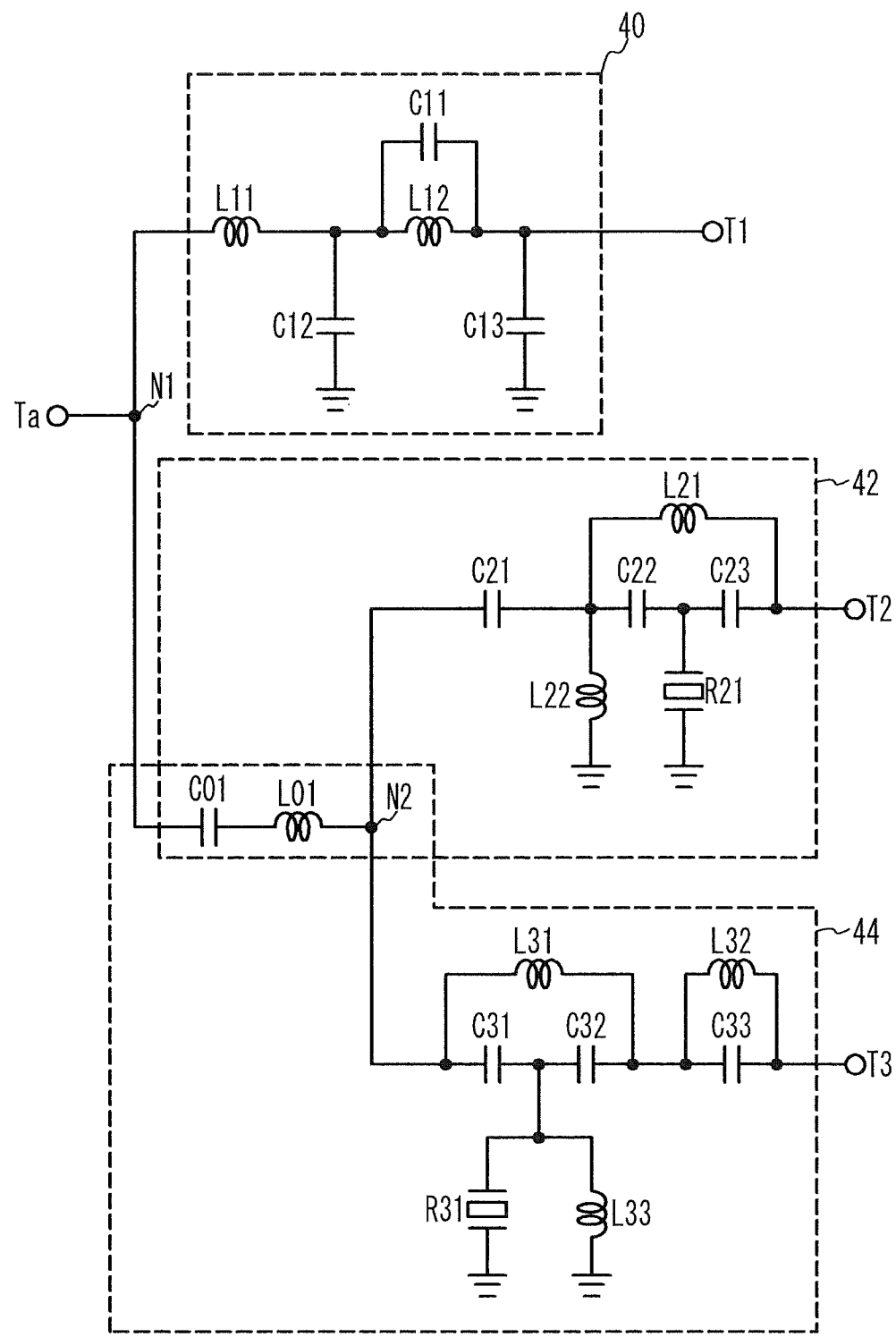
FIG. 4 is a circuit diagram of an exemplary circuit of the first embodiment.

FIG. 4 is a circuit diagram of an exemplary circuit of the first embodiment. As illustrated in FIG. 4, the filter 40 includes capacitors C11 through C13 and inductors L11 and L12. The inductors L11 and L12 are connected in series between the terminals Ta and T1. The capacitor C11 is connected in parallel with the inductor L12 The capacitors C12 and C13 are shunt-connected between the terminals Ta and T1.

The filter 42 includes capacitors C21 through C23, inductors L21 and L22, and an acoustic wave resonator R21. The capacitors C21 through C23 are connected in series between the terminals Ta and T2. The inductor L21 is connected in parallel with the capacitors C22 and C23. The inductor L22 and the acoustic wave resonator R21 are shunt-connected between the terminals Ta and T2.

The filter 44 includes capacitors C31 through C33, inductors L31 through L33, and an acoustic wave resonator R31. The capacitors C31 through C33 are connected in series between the terminals Ta and T3. The inductor L31 is connected in parallel with the capacitors C31 and C32, and the inductor L32 is connected in parallel with the capacitor C33. The inductor L33 and the acoustic wave resonator R31 are shunt-connected between the terminals Ta and T3.

The filters 40, 42, and 44 are commonly coupled to the node N1. The filters 42 and 44 have, as a common circuit, a capacitor C01 and an inductor L01 between the node N1 and a node N2. The capacitor C01 and the inductor L01 are connected in series between the nodes N1 and N2. The filter 40 acts as a low-pass filter, and the filters 42 and 44 act as bandpass filters.

Figure 5:
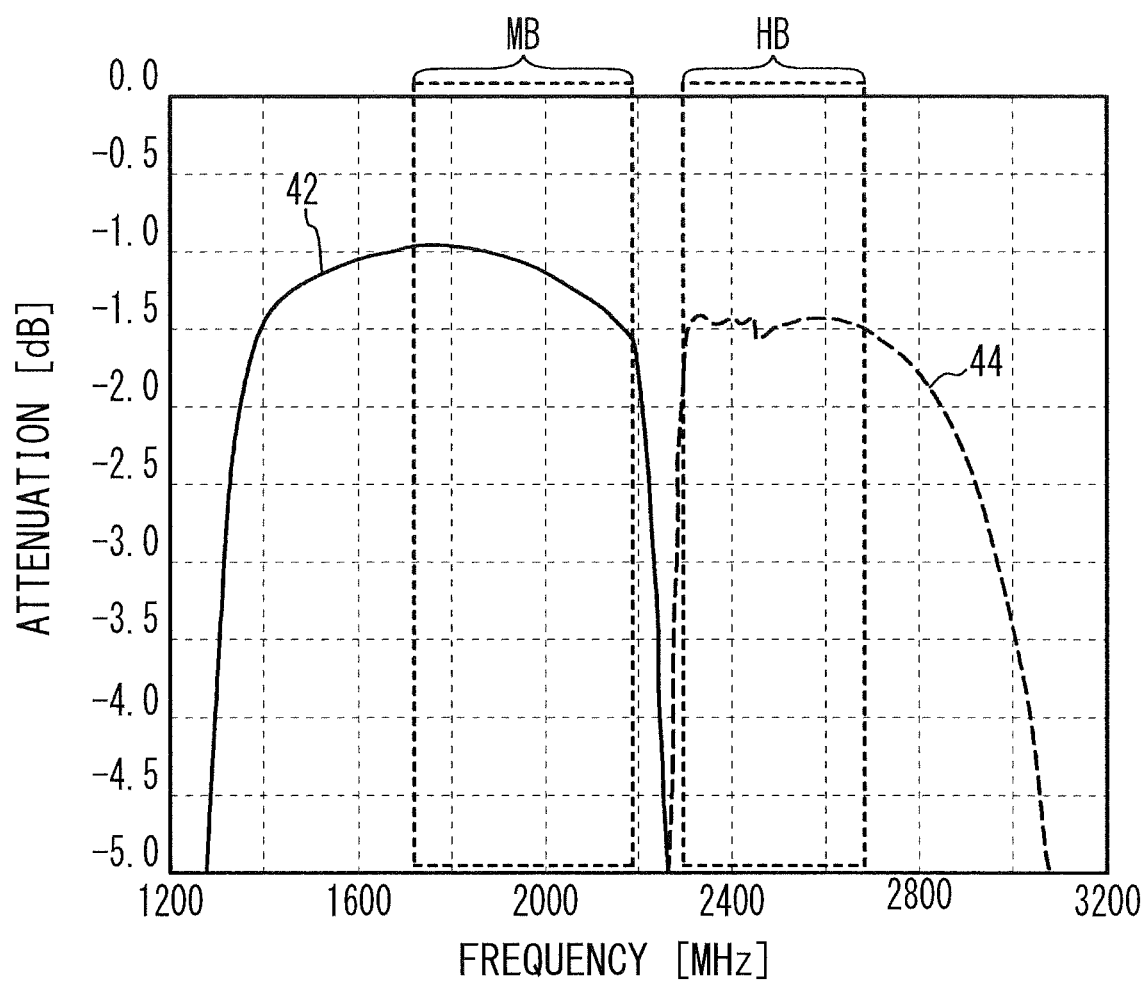
FIG. 5 illustrates the transmission characteristic of the exemplary circuit illustrated in FIG. 4.

FIG. 5 illustrates the transmission characteristic of the exemplary circuit illustrated in FIG. 4. The solid line indicates the transmission characteristic (the transmission characteristic from T2 to Ta) of the filter 42, and the dashed line indicates the transmission characteristic (the transmission characteristic from T3 to Ta) of the filter 44. As illustrated in FIG. 5, the passband of the filter 42 includes a band that is a mid band MB, and the passband of the filter 44 includes a band that is a high band HB. In the band between the mid band MB and the high band HB, the attenuation of the filters 42 and 44 steeply changes.

When the acoustic wave resonators 46 and 47 are formed on the single substrate 10 as illustrated in FIG. 1B, the size of the multiplexer is reduced. However, a signal in the passband of the filter 44 input from the terminal T2 leaks to the terminal T3 through the acoustic wave resonators 46 and 47. In addition, a signal in the passband of the filter 42 input from the terminal T3 leaks to the terminal T2 through the acoustic wave resonators 46 and 47. Accordingly, the isolation characteristic of the multiplexer deteriorates. Thus, the isolation between the acoustic wave resonators 46 and 47 was simulated.

Simulation

Figure 6:
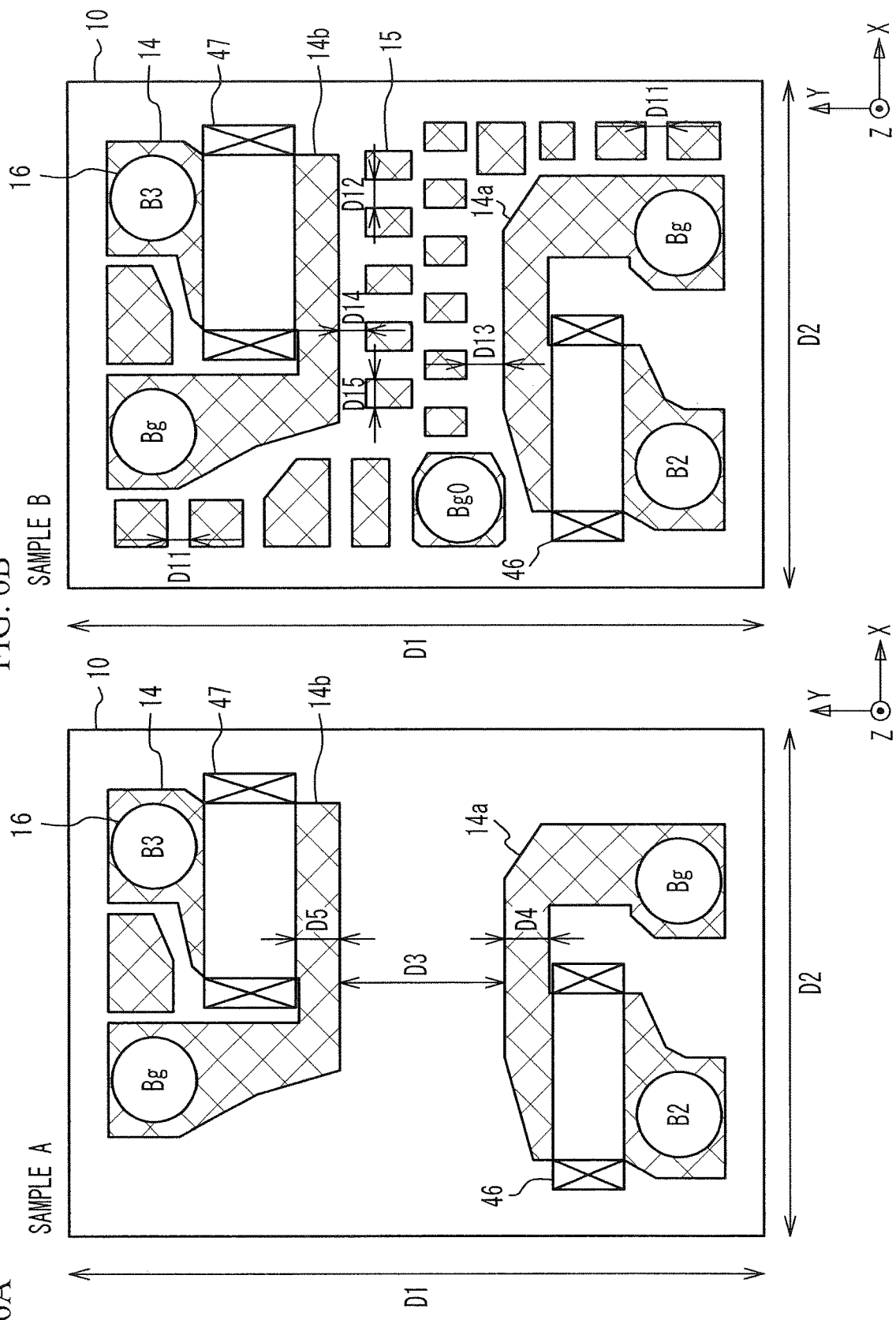
FIG. 6A and FIG. 6B are plan views of samples A and B, respectively.
Figure 7:
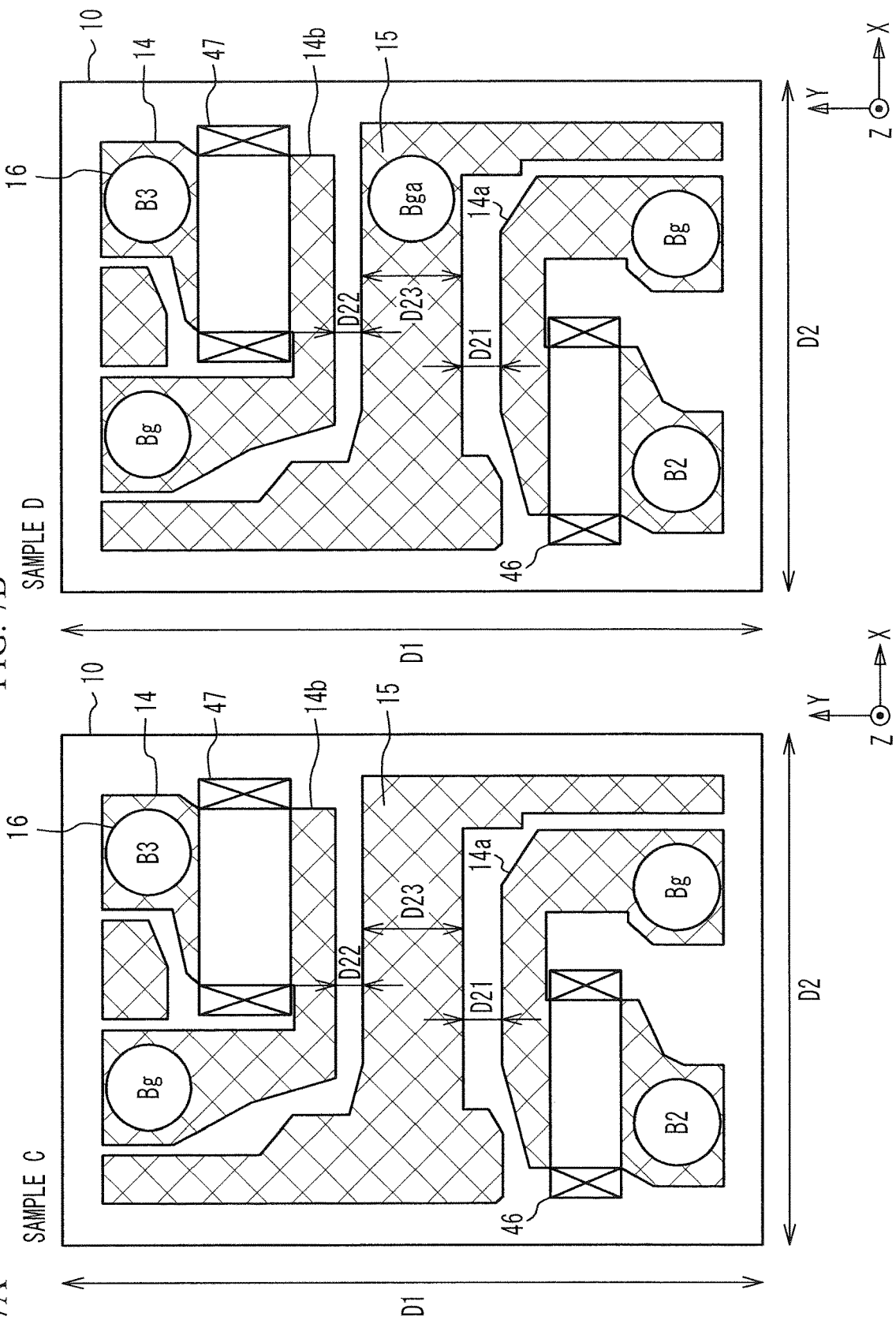
FIG. 7A and FIG. 7B are plan views of samples C and D, respectively.

FIG. 6A through FIG. 8 are plan views of samples A through E, respectively. The sample A corresponds to a comparative example, and the samples B through E correspond to the first embodiment. As illustrated in FIG. 6A, in the sample A, the acoustic wave resonators 46 and 47 and the wiring lines 14 are located on the substrate 10. The arrangement direction in which the electrode fingers of the acoustic wave resonators 46 and 47 are arranged (the propagation direction in which the acoustic wave propagates) is defined as an X direction, the extension direction in which the electrode finger extends is defined as a Y direction, and a direction normal to the substrate 10 is defined as a Z direction.

The acoustic wave resonators 46 and 47 are, for example, the acoustic wave resonators R21 and R31 in FIG. 4. The wiring lines 14 are coupled to the acoustic wave resonators 46 and 47. As illustrated in FIG. 3B, the bumps 16 are located on the wiring lines 14. The bumps 16 include ground bumps Bg coupled to a ground, a bump B2 coupled to the LC circuit 41, and a bump B3 coupled to the LC circuit 43. The dimension of the substrate 10 in the X direction is represented by D1, and the dimension of the substrate 10 in the Y direction is represented by D2. The width of a wiring line 14a between the ground and the acoustic wave resonator R21 is represented by D4, and the width of a wiring line 14b between the ground and the acoustic wave resonator R31 is represented by D5, and the distance between the wiring lines 14a and 14b is represented by D3.

As illustrated in FIG. 6B, in the sample B, a plurality of the metal patterns 15 are located on the substrate 10 between the wiring lines 14a and 14b. A dummy bump Bg0 electrically connected to none of the acoustic wave resonators 46 and 47 is located on one metal pattern 15. The distance between the adjacent metal patterns 15 in the Y direction is represented by D11, the distance between the adjacent metal patterns 15 in the X direction is represented by D12, the distance between the wiring line 14a and the metal pattern 15 adjacent to the wiring line 14a is represented by D13, and the distance between the wiring line 14b and the metal pattern 15 adjacent to the wiring line 14b is represented by D14. The width of the metal pattern 15 in the X direction is represented by D15. Other structures and dimensions are the same as those of the sample A.

As illustrated in FIG. 7A, in the sample C, one metal pattern 15 is located between the acoustic wave resonators 46 and 47. The metal pattern 15 is electrically connected to none of the acoustic wave resonators R21 and R31 in the package 45 illustrated in FIG. 3B. The distance between the wiring line 14a and the metal pattern 15 is represented by D21, and the distance between the wiring line 14b and the metal pattern 15 is represented by D22. The width of the metal pattern 15 in the Y direction is represented by D23. Other structures and dimensions are the same as those of the sample B, and the description thereof is thus omitted.

As illustrated in FIG. 7B, in the sample D, a ground bump Bga is located on the metal pattern 15. The ground bump Bga is electrically connected to the ground bump Bg in the package 45. Other structures are the same as those of the sample C, and the description thereof is thus omitted.

Figure 8:
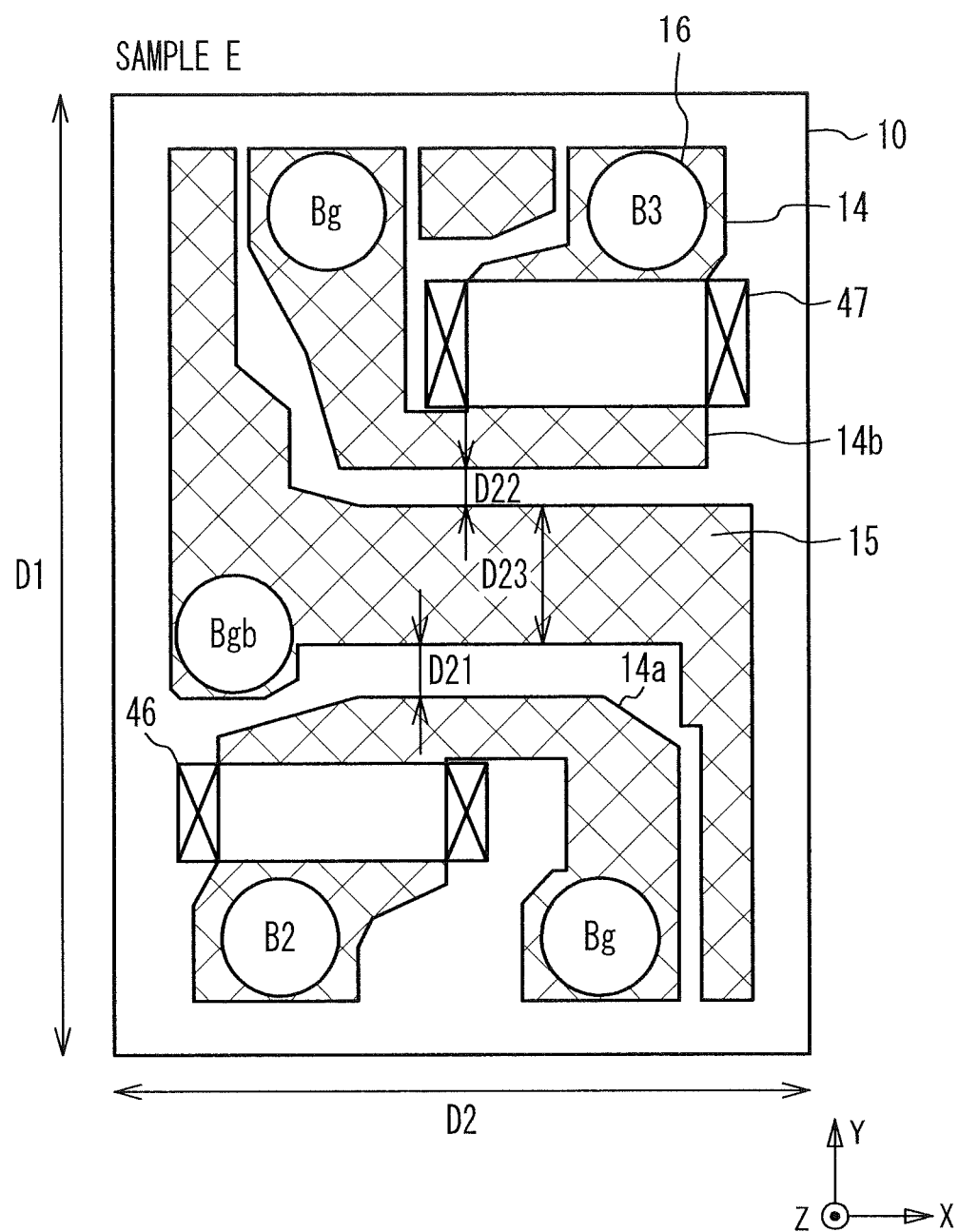
FIG. 8 is a plan view of a sample E.

As illustrated in FIG. 8, in the sample E, a ground bump Bgb is located on the metal pattern 15. The ground bump Bgb is electrically independent from the ground bumps Bg (i.e., the grounds of the filters 40, 42, and 44) in the package 45 and the multiplexer. The ground bump Bg is coupled, through the terminal 28, to the ground of a circuit board (for example, the substrate 36 in FIG. 3A) on which the package 45 is mounted. Other structures are the same as those of the sample C, and the description thereof is thus omitted.

The simulation was conducted by combining the results of the electromagnetic field simulation of a package excluding the acoustic wave resonators R21 and R31 and S parameters of the acoustic wave resonators R21 and R31. The calculated isolation from the terminal T2 to the terminal T3 was simulated as the isolation from the terminal 28 to which the bump B2 is coupled to the terminal 28 to which the bump B3 is coupled.

Simulation conditions are as follows.

Figure 9A:
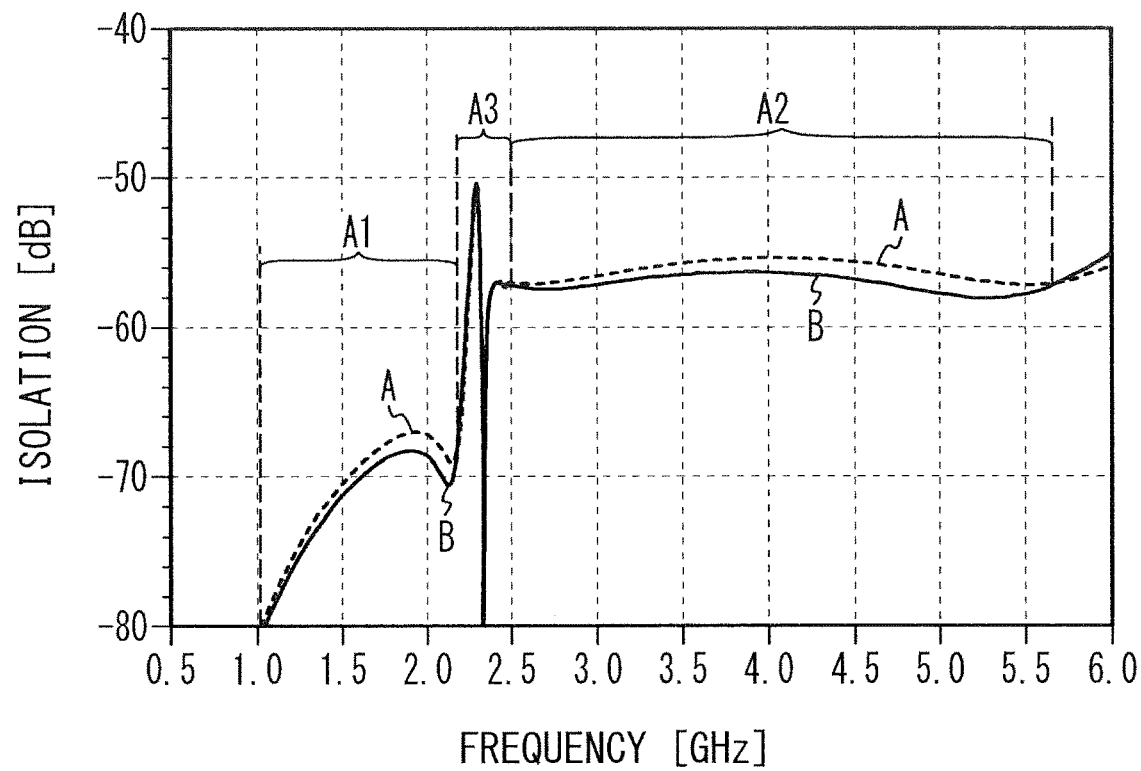
FIG. 9A illustrates the isolation characteristics of the samples A and B.

Acoustic wave resonator 46: Surface acoustic wave resonator with a resonant frequency of 2.26 GHz
Acoustic wave resonator 47: Surface acoustic wave resonator with a resonant frequency of 2.27 GHz
Substrate 10: 42° rotated Y-cut X-propagation lithium tantalate substrate with a thickness of 150 μm
Circuit board 20: Ceramic substrate with a thickness of 140 μm
Dimensions: D1=870 μm, D2=630 μm, D3=210 μm, D4=D5=50 μm, D11=30 μm, D12=36 μm, D13=51 μm, D14=34 μm, D15=36 μm, D21=51 μm, D22=34 μm, and D23=125 μm FIG. 9A through FIG. 10B illustrate the isolation characteristics of the samples A and each of the samples B through E, respectively. As illustrated in FIG. 9A, the isolation of the sample B is better than that of the sample A in a range A1 from 1 GHz to approximately 2.2 GHz and a range A2 from approximately 2.5 GHz to approximately 5.7 GHz. The isolation is approximately the same between the samples A and B in a range A3 from approximately 2.2 GHz to approximately 2.5 GHz.

Figure 9B:
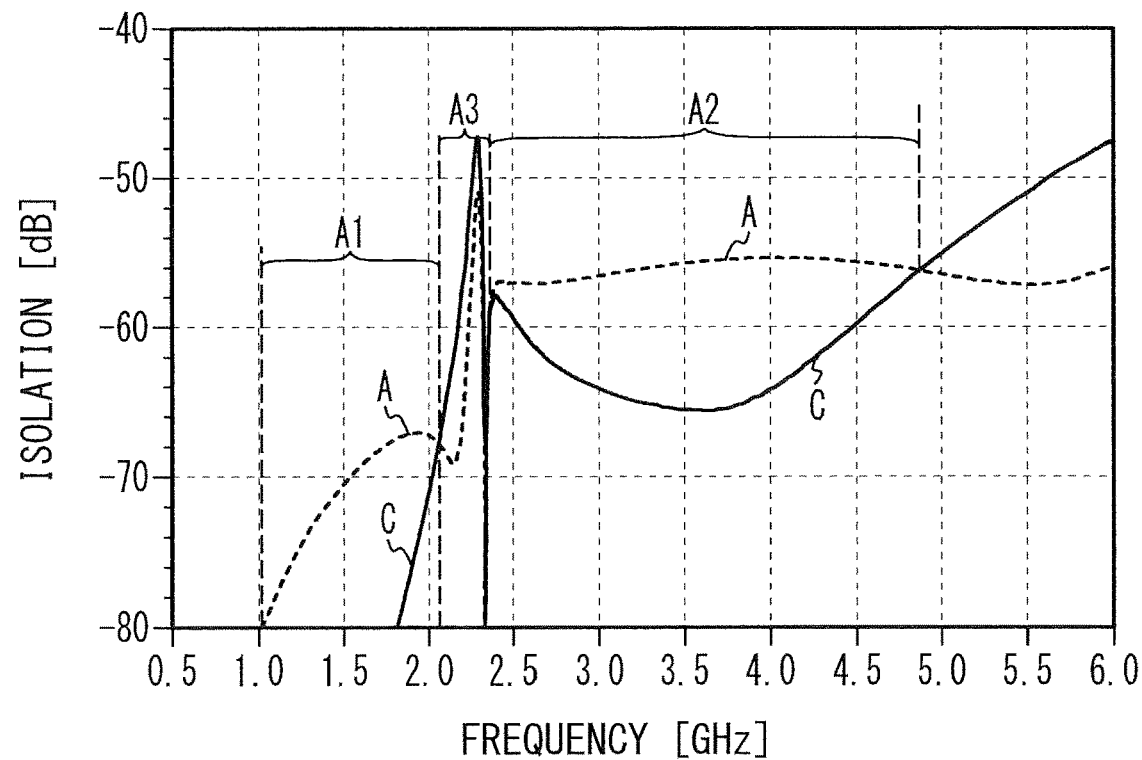
FIG. 9B illustrates the isolation characteristics of the samples A and C.

As illustrated in FIG. 9B, the isolation of the sample C is better than the isolation of the sample A in the range A1 from 1 GHz to approximately 2.1 GHz and the range A2 from approximately 2.3 GHz to approximately 4.8 GHz. However, the isolation of the sample A is better than the isolation of the sample C in the range A3 from approximately 2.1 GHz to approximately 2.3 GHz.

Figure 10A:
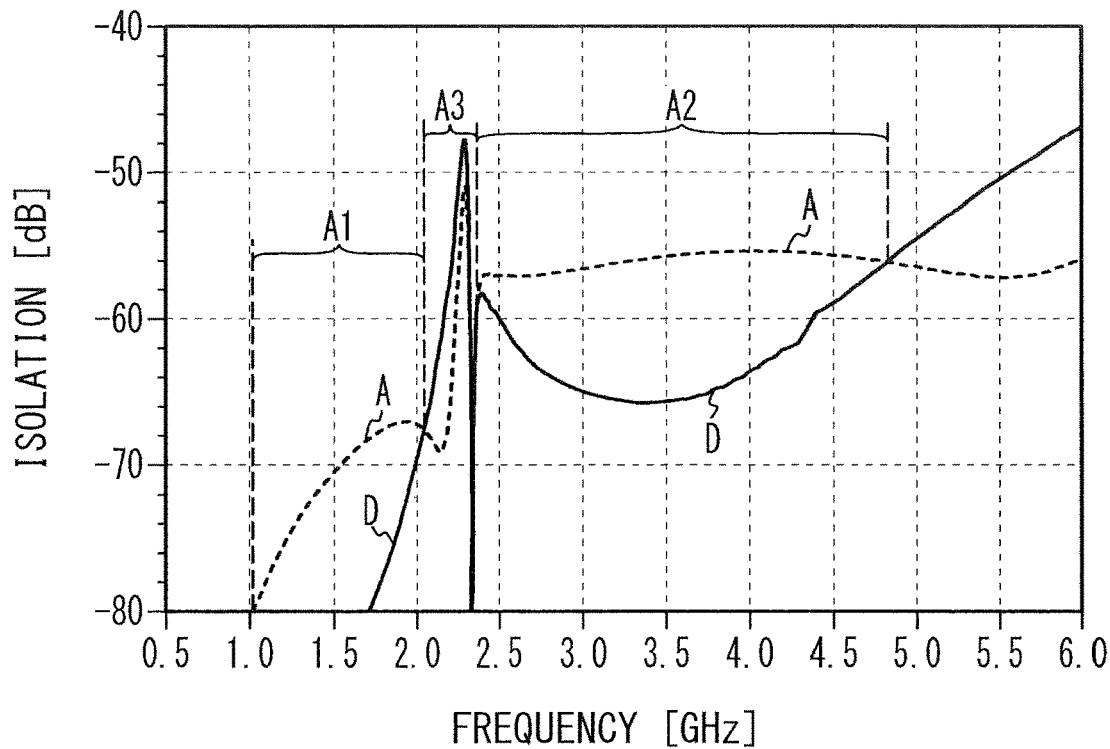
FIG. 10A illustrates the isolation characteristics of the samples A and D.

As illustrated in FIG. 10A, the isolation of the sample D is better than that of the sample A in the range A1 from 1 GHz to approximately 2.1 GHz and the range A2 from approximately 2.3 GHz to 4.8 GHz. However, the isolation of the sample A is better than the isolation of the sample D in the range A3 from approximately 2.1 GHz to approximately 2.3 GHz.

Figure 10B:
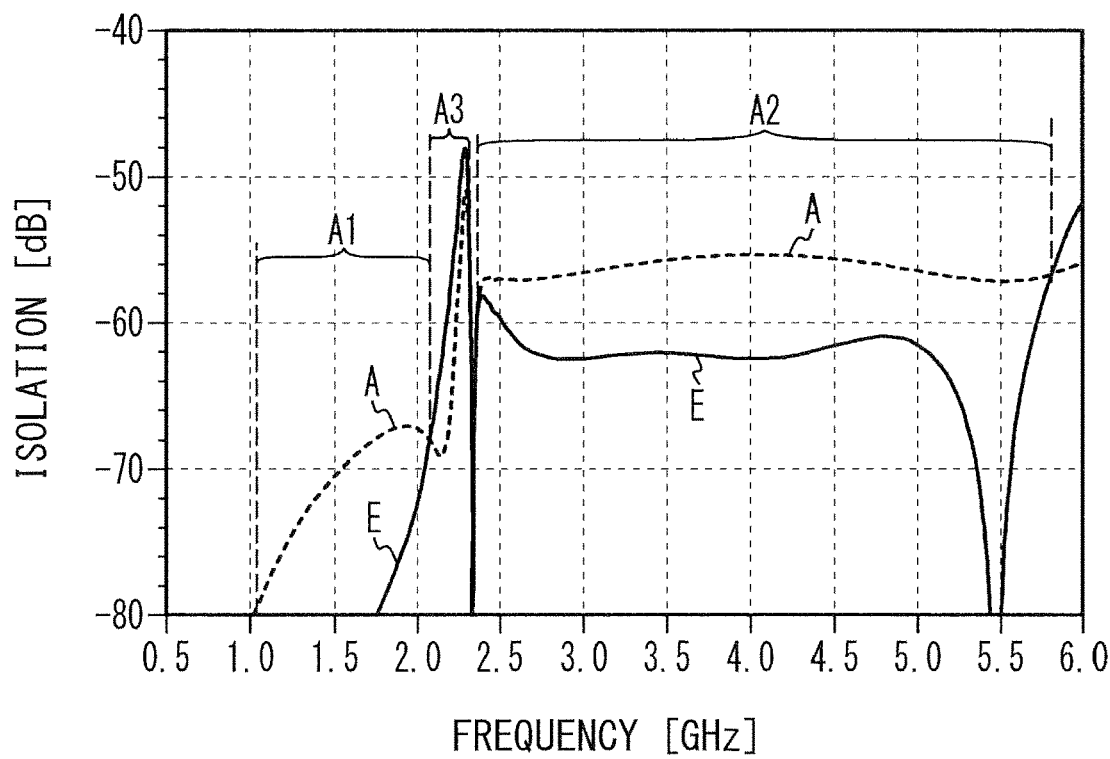
FIG. 10B illustrates the isolation characteristics of the samples A and E.

As illustrated in FIG. 10B, the isolation of the sample E is better than that of the sample A in the range A1 from 1 GHz to approximately 2.1 GHz and the range A2 from approximately 2.3 GHz to approximately 5.8 GHz. However, the isolation of the sample A is better than the isolation of the sample E in the range A3 from approximately 2.1 GHz to approximately 2.3 GHz.

Figure 11:
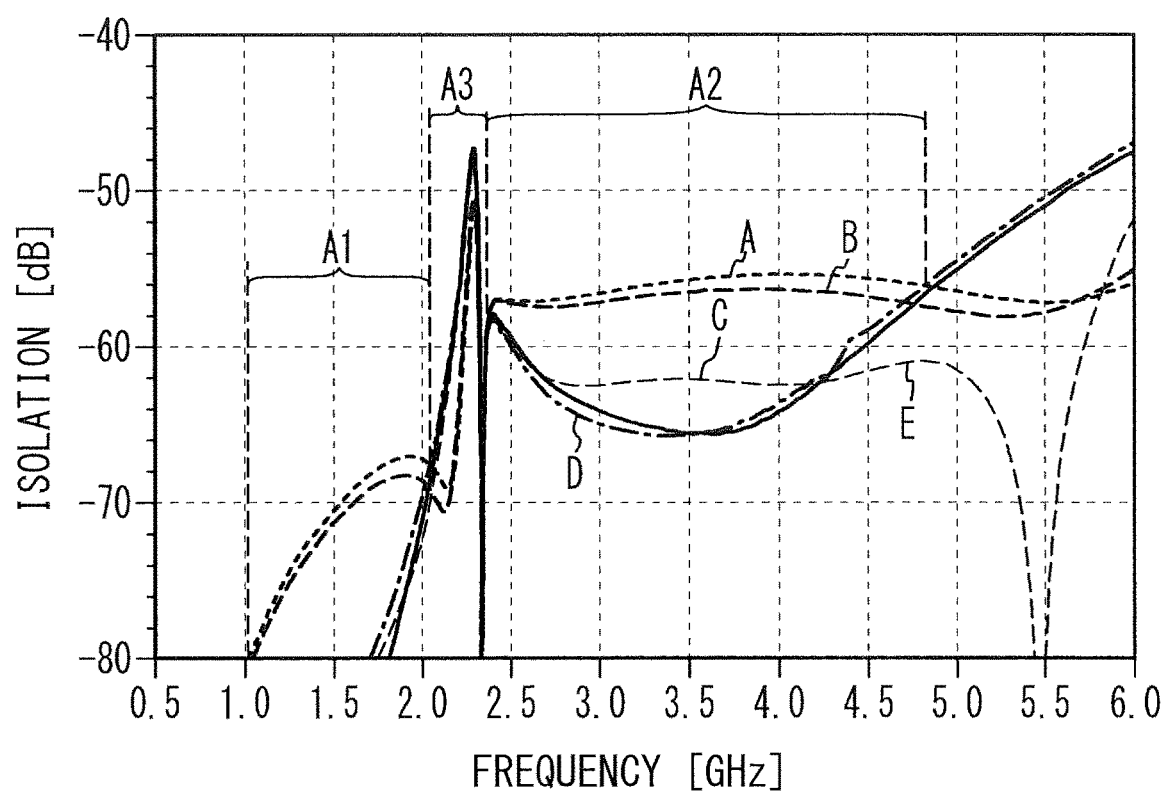
FIG. 11 illustrates the isolation characteristics of the samples A through E.

FIG. 11 illustrates the isolation characteristics of the samples A through E. As illustrated in FIG. 11, the isolation of the samples C through E is better than that of the sample B in the range A2 from approximately 2.3 GHz to approximately 5 GHz. However, in the range A3 from approximately 2.1 GHz to approximately 2.3 GHz, the isolation of the samples C through E deteriorates more than that of the sample A, while the isolation of the sample B does not deteriorate. As seen above, in the sample B, the isolation in the range A3 does not deteriorate, and the isolation of the sample B is improved in the ranges A1 and A2. In the samples C through E, the isolation deteriorates in the range A3, but the isolation is improved more than that of the sample B in the range A2. As seen above, the arrangement of the metal pattern 15 is appropriately selected to improve the isolation.

First Variation of the First Embodiment

Figure 12:
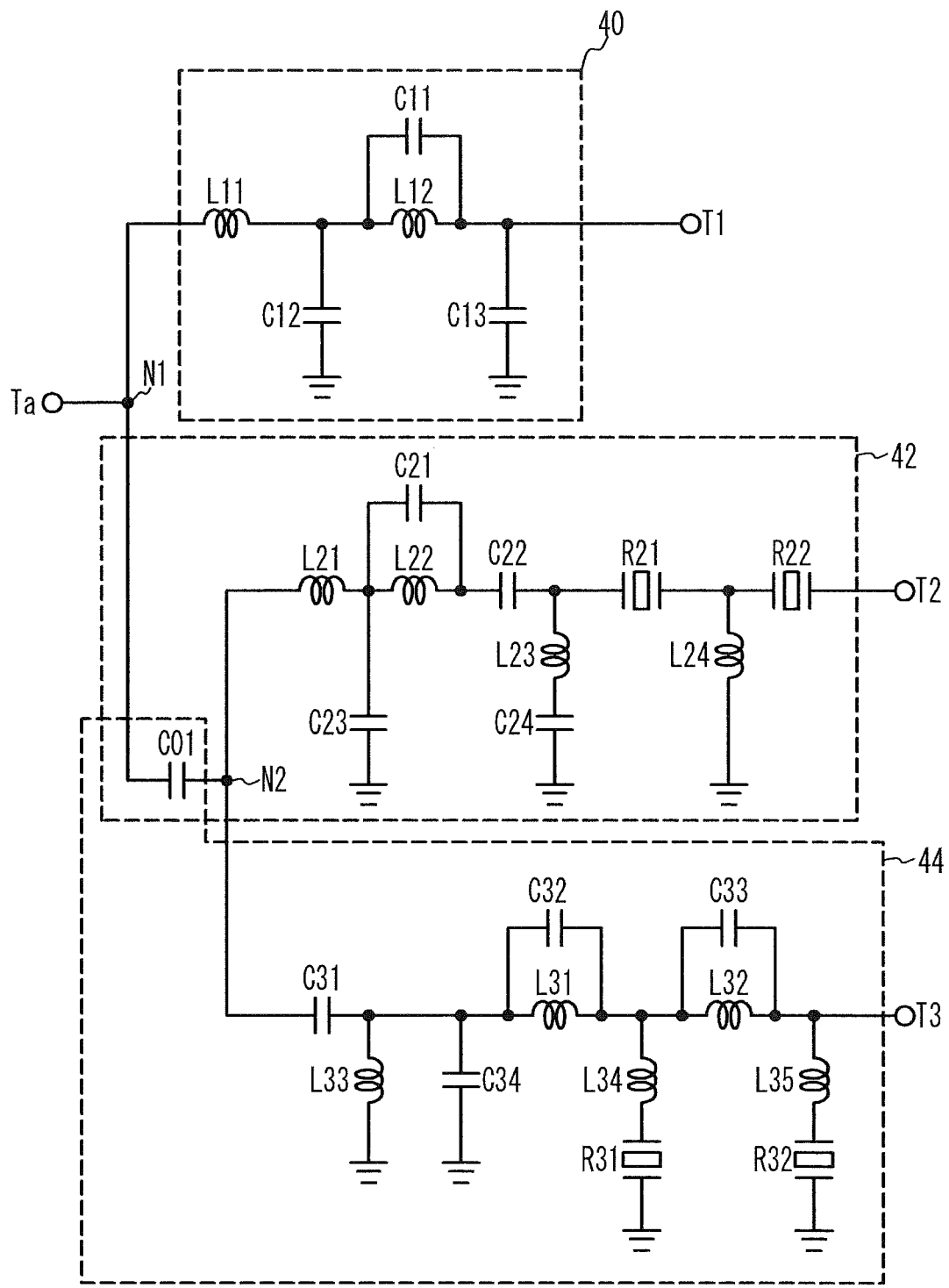
FIG. 12 is a circuit diagram of an exemplary circuit of a first variation of the first embodiment.

FIG. 12 is a circuit diagram of an exemplary circuit of a first variation of the first embodiment. As illustrated in FIG. 12, the filter 40 includes the capacitors C11 through C13 and the inductors L11 and L12. The filter 42 includes capacitors C21 through C24, inductors L21 through L24, and acoustic wave resonators R21 and R22. The filter 44 includes the capacitors C31 through C33, inductors L31 through L35, and acoustic wave resonators R31 and R32. The filters 42 and 44 share the capacitor C01. The acoustic wave resonators R21, R22, R31, and R32 are located on the single substrate 10 illustrated in FIG. 3B as in the first embodiment.

Second Variation of the First Embodiment

Figure 13:
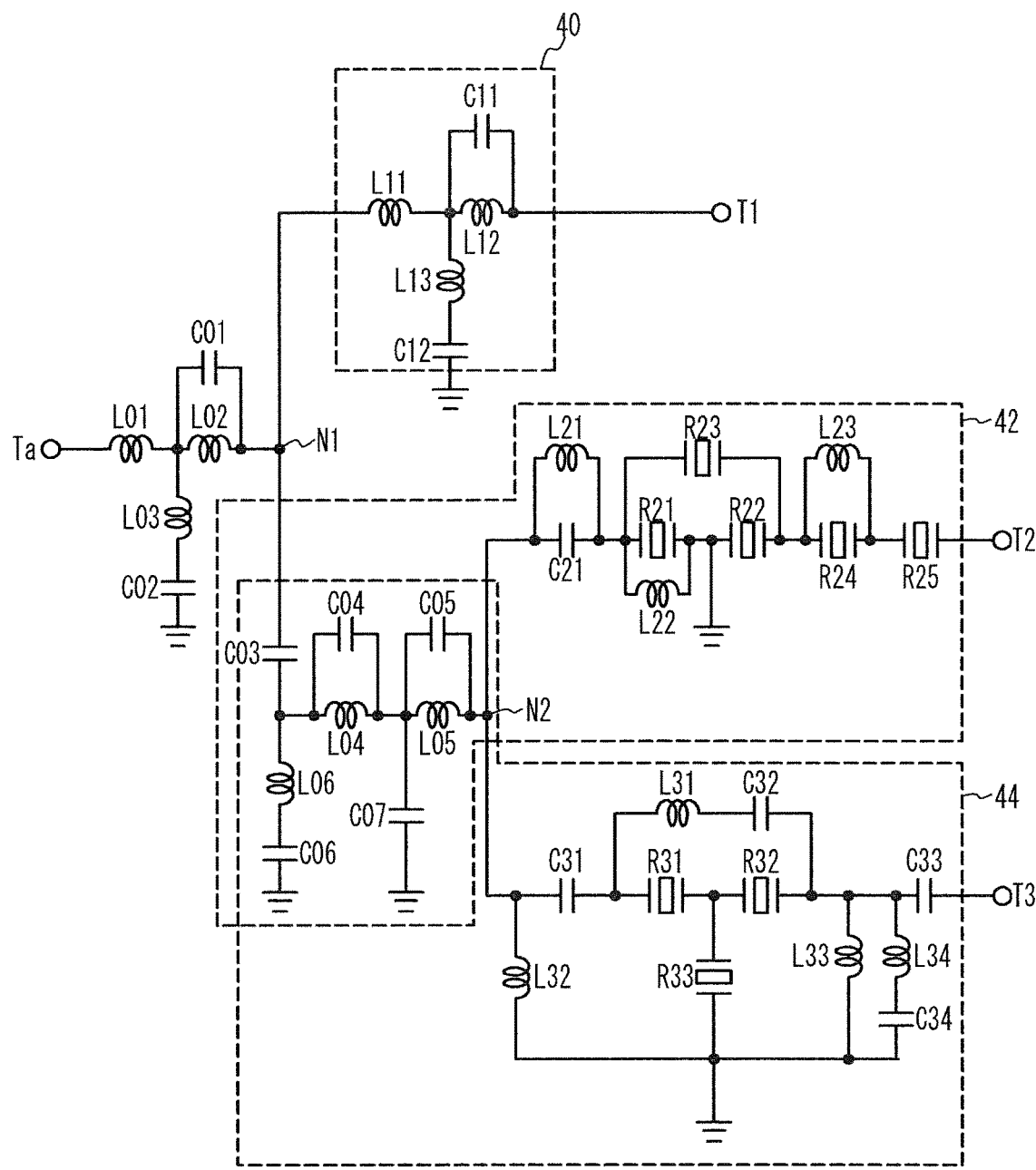
FIG. 13 is a circuit diagram of an exemplary circuit of a second variation of the first embodiment.

FIG. 13 is a circuit diagram of an exemplary circuit in accordance with a second variation of the first embodiment. As illustrated in FIG. 13, capacitors C01 and C02 and inductors L01 through L03 are connected between the terminal Ta and the node N1. The filter 40 includes the capacitors C11 and C12 and the inductors L11 through L13. The filter 42 includes the capacitor C21, the inductors L21 through L23, and acoustic wave resonators R21 through R25. The filter 44 includes the capacitors C31 through C34, the inductors L31 through L34, and acoustic wave resonators R31 through R33. The filters 42 and 44 share capacitors C03 through C07 and inductors L04 through L06.

As in the first and second variations of the first embodiment, the filter 42 may include a plurality of the acoustic wave resonators 46. The filter 44 may include a plurality of the acoustic wave resonators 47. In addition, the acoustic wave resonators 46 may be connected in series between the terminals Ta and T2. The acoustic wave resonators 47 may be connected in series between the terminals Ta and T3. It is sufficient if at least one resonator of a plurality of the acoustic wave resonators 46 and at least one resonator of a plurality of the acoustic wave resonators 47 are located on the single substrate 10 illustrated in FIG. 3B.

In the first embodiment and the variations thereof, the filter 42 (a first filter) is connected between the terminal Ta (a first terminal) and the terminal T2 (a second terminal), and includes a first capacitor, a first inductor, and one or more first acoustic wave resonators. The filter 44 (a second filter) is connected between the terminal Ta and the terminal T3 (a third terminal), and includes a second capacitor, a second inductor, and one or more second acoustic wave resonators. The passband of the filter 44 (a second passband) is higher than the passband of the filter 42 (a first passband).

At least one acoustic wave resonator of one or more acoustic wave resonators 46 (one or more first acoustic wave resonators) and at least one acoustic wave resonator of one or more acoustic wave resonators 47 (one or more second acoustic wave resonators) are located on the upper surface (a surface) of the substrate 10. The metal pattern 15 (a metal structure) is located on the upper surface of the substrate 10, and is located between the at least one acoustic wave resonator 46 and the at least one acoustic wave resonator 47.

This structure improves the isolation more than the sample A having no metal pattern 15 as with the samples B through E that were simulated.

The metal structure is a metal film, such as the metal pattern 15, located on the surface of the substrate 10. This structure improves the isolation.

As in the sample B, the metal pattern 15 (a metal film) is provided in plurality, and the metal patterns 15 are arranged in a direction intersecting with a direction from the at least one acoustic wave resonator 46 to at least one acoustic wave resonator 47. This structure improves the isolation.

As in the samples C through E, the metal pattern 15 (a metal film) is located so as to completely cover the at least one acoustic wave resonator 47 when the at least one acoustic wave resonator 47 is viewed from the at least one acoustic wave resonator 46. This structure improves the isolation.

As in the samples B and C, the metal pattern 15 may float above the filters 42 and the filter 44. That is, the metal pattern 15 is electrically connected to none of the filters 42 and 44 and other conductive patterns on the surface of the substrate 10. As in the sample D, the metal pattern 15 may be electrically connected to grounds of the filter 42 and the filter 44 in the multiplexer. As in the sample E, the metal pattern 15 may be electrically connected to none of the filter 42 and the filter 44 in the multiplexer, and may be electrically connected to a ground independent from the filter 42 and the filter 44.

As illustrated in FIG. 4, FIG. 12, and FIG. 13, in the filter 42, between the terminals Ta and T2, the capacitor is connected in series and/or shunt-connected, the inductor is connected in series and/or shunt-connected, and one or more acoustic wave resonators 46 are connected in series and/or shunt-connected. In the filter 44, between the terminals Ta and T3, the capacitor is connected in series and/or shunt-connected, the inductor is connected in series and/or shunt-connected, and one or more acoustic wave resonator 47 are connected in series and/or shunt-connected. This structure allows the filters 42 and 44 to form the bandpass filter, the low-pass filter, or the high-pass filter.

The widths of the passbands of the filters 42 and 44 are 300 MHz or greater. It is difficult to form a filter having such a wide passband only with the acoustic wave resonator. Thus, the filters 42 and 44 are structured of the capacitor, the inductor, and the acoustic wave resonators. Accordingly, the passband is widened.

At least a part of the passband of the filter 42 overlaps with at least a part of the guard band (a second guard band) of the filter 44. At least a part of the passband of the filter 44 overlaps with at least a part of the guard band (a first guard band) of the filter 42. In such filters 42 and 44, the steepness of the attenuation between the passband and the guard band is required to be improved. Thus, the acoustic wave resonators 46 and 47 are used. However, the deterioration in isolation between the acoustic wave resonators 46 and 47 deteriorates the isolation between the filters 42 and 44. Thus, the metal pattern 15 is preferably provided.

The passband of the filter 42 and the guard band of the filter 44 are wider than the band from 1700 MHz to 2200 MHz, and the passband of the filter 44 and the guard band of the filter 42 are wider than the band from 2300 MHz to 2690 MHz. In this case, the steepness of the attenuation between the passband and the guard band is required to be improved in particular. Thus, the acoustic wave resonators 46 and 47 are used. However, the deterioration in isolation between the acoustic wave resonators 46 and 47 deteriorates the isolation between the filters 42 and 44. Thus, the metal pattern 15 is preferably provided.

A case where the filter 42 is a bandpass filter has been described, but the filter 42 may be a low-pass filter. A case where the filter 44 is a bandpass filter has been described, but the filter 44 may be a high-pass filter. A case where the multiplexer includes three filters 40, 42, and 44 has been described, but the multiplexer may include only two filters, or may include four or more filters.

Although the embodiments of the present invention have been described in detail, it is to be understood that the various change, substitutions, and alterations could be made hereto without departing from the spirit and scope of the invention.

What is claimed is:

1. A multiplexer comprising:
   a first terminal;
   a second terminal;
   a third terminal;
   a first filter that is connected between the first terminal and the second terminal, includes a first capacitor, a first inductor, and one or more first acoustic wave resonators, and has a first passband;
   a second filter that is connected between the first terminal and the third terminal, includes a second capacitor, a second inductor, and one or more second acoustic wave resonators, and has a second passband higher than the first passband, the second passband not overlapping with the first passband;
   a substrate that has a surface on which a film is directly located, at least one first acoustic wave resonator of the one or more first acoustic wave resonators and at least one second acoustic wave resonator of the one or more second acoustic wave resonators including the film, the at least one first acoustic wave resonator being shunt-connected between the first terminal and the second terminal; the at least one second acoustic wave resonator being shunt-connected between the first terminal and the third terminal; a resonant frequency of the at least one first acoustic wave resonator and a resonant frequency of the at least one second acoustic wave resonator being located between the first passband and the second passband; and
   a metal structure that is located on the surface, and is located between the at least one first acoustic wave resonator and the at least one second acoustic wave resonator,
   wherein
   the resonant frequency of the at least one first acoustic wave resonator is formed by the at least one first acoustic wave resonator without a separate inductor or capacitor and the resonant frequency of the at least one second acoustic wave resonator is formed by the at least one second acoustic wave resonator without a separate inductor or capacitor, and
   no capacitor is connected in parallel with the at least one first acoustic wave resonator between a first end of the at least one first acoustic wave resonator and a second end of the at least one first acoustic wave resonator and no capacitor is connected in parallel with the at least one second acoustic wave resonator between a first end of the at least one second acoustic wave resonator and a second end of the at least one second acoustic wave resonator.

2. The multiplexer according to claim 1, further comprising
   a multilayered body including dielectric layers being stacked, the first capacitor, the first inductor, the second capacitor and the second inductor, being separated from the substrate.

3. The multiplexer according to claim 2, wherein
   the multilayered body includes a first multilayered body including the first capacitor and the first inductor and not including the second capacitor and the second inductor and a second multilayered body including the second capacitor and the second inductor and not including the first capacitor and the first inductor.

4. The multiplexer according to claim 3, further comprising another substrate, the first multilayered body and the second multilayered body are located on the another substrate and the substrate is located on the another substrate between the first multilayered body and the second multilayered body.

5. The multiplexer according to claim 2, further comprising another substrate on which the substrate and the multilayered body are located.

6. The multiplexer according to claim 1, wherein
   the metal structure is a metal film located on the surface.

7. The multiplexer according to claim 6, wherein the metal film is provided in plurality, the metal films are arranged in a direction substantially perpendicular to a direction from the at least one first acoustic wave resonator to the at least one second acoustic wave resonator, and the metal films are located in different regions on the surface and separated from each other.

8. The multiplexer according to claim 6, wherein
   the metal film is located so as to cover the at least one second acoustic wave resonator when the at least one second acoustic wave resonator is viewed from the at least one first acoustic wave resonator.

9. The multiplexer according to claim 6, wherein
a width of the metal film in a direction from the at least one first acoustic wave resonator to the at least one second acoustic wave resonator is larger than a first distance between the metal film and a first wire line in the direction and a second distance between the metal film and a second wire line in the direction, the first wire line is connected to the at least one second acoustic wave resonator and the second wire line connected to the at least one second acoustic wave resonator.

10. The multiplexer according to claim 1, wherein
the first filter has a first guard band,
the second filter has a second guard band,
at least a part of the first passband overlaps with at least a part of the second guard band, and
at least a part of the second passband overlaps with at least a part of the first guard band.

11. The multiplexer according to claim 10, wherein
the first passband and the second guard band are wider than a band from 1700 MHz to 2200 MHz, and the second passband and the first guard band are wider than a band from 2300 MHz to 2690 MHz.

12. The multiplexer according to claim 1, wherein
the metal structure is electrically connected to none of the first filter, the second filter, and other conductive patterns on the surface.

13. The multiplexer according to claim 1, wherein
the metal structure is electrically connected to grounds of the first filter and the second filter in the multiplexer.

14. The multiplexer according to claim 1, wherein
the metal structure is electrically connected to none of the first filter and the second filter in the multiplexer, and is electrically connected to a ground electrically independent from the first filter and the second filter.

15. The multiplexer according to claim 1, wherein
between the first terminal and the second terminal, the first capacitor is connected in series and/or shunt-connected, and the first inductor is connected in series and/or shunt-connected, and
between the first terminal and the third terminal, the second capacitor is connected in series and/or shunt-connected, and the second inductor is connected in series and/or shunt-connected.

16. The multiplexer according to claim 1, wherein
a width of the first passband is 300 MHz or greater, and
a width of the second passband is 300 MHz or greater.

17. The multiplexer according to claim 1, wherein
the surface of the substrate is a surface of a piezoelectric substrate, and
the file includes an interdigital transducer.

18. The multiplexer according to claim 1, wherein
the surface of the substrate is a surface of a sapphire substrate, a spinel substrate, an alumina substrate, a glass substrate, a crystal substrate, or a silicon substrate, and
the film includes a lower electrode, an upper electrode and a piezoelectric film being sandwiched by the lower electrode and the upper electrode.

* * * * *